(12) United States Patent
Fuderer et al.

(10) Patent No.: US 11,733,334 B2
(45) Date of Patent: Aug. 22, 2023

(54) IMAGE QUALITY ASSESSMENT OF MAGNETIC RESONANCE IMAGES USING A PHANTOM

(71) Applicant: KONINKLIJKE PHILIPS N.V., Eindhoven (NL)

(72) Inventors: Miha Fuderer, Eindhoven (NL); Silke Hey, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 205 days.

(21) Appl. No.: 17/252,753

(22) PCT Filed: Jun. 17, 2019

(86) PCT No.: PCT/EP2019/065816
§ 371 (c)(1),
(2) Date: Dec. 16, 2020

(87) PCT Pub. No.: WO2019/243224
PCT Pub. Date: Dec. 26, 2019

(65) Prior Publication Data
US 2021/0255264 A1  Aug. 19, 2021

(30) Foreign Application Priority Data
Jun. 19, 2018  (EP) .................................... 18178391

(51) Int. Cl.
*G01R 33/54* (2006.01)
*G01R 33/48* (2006.01)

(52) U.S. Cl.
CPC ......... *G01R 33/54* (2013.01); *G01R 33/4824* (2013.01)

(58) Field of Classification Search
CPC ..... G01R 33/4824; G01R 33/54; G01R 33/58
See application file for complete search history.

(56) References Cited

U.S. PATENT DOCUMENTS

| | | | |
|---|---|---|---|
| 5,336,999 | A | 8/1994 | Mansfield et al. |
| 5,402,067 | A | 3/1995 | Pauly et al. |

(Continued)

FOREIGN PATENT DOCUMENTS

| | | |
|---|---|---|
| JP | 337046 A | 2/1991 |
| JP | 2015208387 A | 11/2015 |
| WO | 2017038345 A1 | 9/2017 |

OTHER PUBLICATIONS

Huang et al "Phantom based Characterization of Distortion on a Magnetic Resonance Imaging Simulator for Radiation Oncology" Institute of Physics and Engineering in Medicine, 61 p. 774-790 (2016).

(Continued)

*Primary Examiner* — Jay Patidar

(57) ABSTRACT

A method of magnetic resonance (MR) imaging includes a phantom that is inexpensive to produce and enables simple, practical and fast assessment of image sharpness, in particular for checking image quality of MR imaging with spiral acquisition. The method includes subjecting a phantom, which comprises a volume filled with a bulk of granules of solid material surrounded by a liquid, to an imaging sequence, acquiring MR signals from the phantom, reconstructing an MR image from the acquired MR signals, and deriving a measure of the local image sharpness in two or more different image regions from the MR image, wherein each image region is a representation of a part of the phantom volume.

17 Claims, 2 Drawing Sheets

(56) References Cited

U.S. PATENT DOCUMENTS

| | | | |
|---|---|---|---|
| 5,978,530 | A | 11/1999 | Russell et al. |
| 8,238,634 | B1 | 8/2012 | Meyer et al. |
| 8,723,523 | B2 | 5/2014 | Tsuda |
| 2004/0044280 | A1 | 3/2004 | Paley et al. |
| 2008/0297151 | A1* | 12/2008 | Hirata .................... G01R 33/58 324/307 |
| 2012/0068699 | A1 | 3/2012 | Horkay et al. |
| 2012/0201438 | A1 | 8/2012 | Vermandel et al. |
| 2013/0200900 | A1 | 8/2013 | Buurman et al. |
| 2016/0363644 | A1* | 12/2016 | Wang .................... G01R 33/58 |
| 2016/0363645 | A1 | 12/2016 | Reeder et al. |

OTHER PUBLICATIONS

Moser et al "Extraction and validation of correlation lengths from interstitial velocity fields using diffusion-weighted MRI",Magnetic Resonance Imaging, vol. 22, No. 2, Feb. 1, 2004 (Feb. 1, 2004), pp. 257-268.

International Search Report and Written Opinion From PCT/EP2019/065816 dated Sep. 17, 2019.

Prashanth Palaniappan et al: "De-noising of dynamic magnetic resonance images by the combined application of wavelet filtering and Karhunen-Loeve Transform (KLT)",Journal of Cardiovascular Magnetic Resonance, Biomed Central Ltd, London UK,vol. 14, No. Suppl 1, Feb. 1, 2012 (Feb. 1, 2012), p. W71.

Piekarski et al: "Two-dimensional XD-GRASP provides better image quality than conventional 2D cardiac cine MRI for patients who cannot suspend respiration". Magnetic Resonance Materials in Physics, Biology and Medicine, Springer, DE, GB, vol. 31, No. 1,Oct. 24, 2017 (Oct. 24, 2017), pp. 49-59.

Ioannis Delakis et al: "Wavelet-based de-noising algorithm for images acquired with parallel magnetic resonance imaging (MRI); Wavelet-based de-noising for parallel MRI", Physics in Medicine and Biology, Institute of Physics Publishing, Bristol GB, vol. 52 , No. 13, Jul. 7, 2007 (Jul. 7, 2007),pp. 3741-3751.

Kim Junghwan et al.: "Dual Tuned Proton/Lithium RF array Development; Feasibility Study at 7T MRI", International Society for Magnetic Resonance in Medicine, ISMRM, 2030 Addison Street, 7th Floor, Berkeley, CA 94704 USA, No. 4925, Apr. 28, 2014 (Apr. 28, 2014).

Sarah A. Peel et al: "Cross-sectional and In-plane coronary vessel wall imaging using a local inversion prepulse and spiral read-out: A comparison between 1.5 and 3 tesla", Journal of Magnetic Resonance Imaging, vol. 35, No. 4, Dec. 14, 2011 (Dec. 14, 2011), pp. 969-975.

Wech Tobias et al: "Resolution evaluation of MR images reconstructed by iterative thresholding algorithms for compressed sensing", Medical Physics, AIP, Melville, NY, US, vol. 39 , No. 7, Jun. 27, 2012 (Jun. 27, 2012), pp. 4328-4338.

Jirák Daniel et al: "Phantoms for texture analysis of MR images. Long-term and multi-center study". Medical Physics, AIP, Melville, NY, US,vol. 31, No. 3, Feb. 26, 2004 (Feb. 26, 2004), pp. 316-622.

* cited by examiner

IMAGE QUALITY ASSESSMENT OF MAGNETIC RESONANCE IMAGES USING A PHANTOM

CROSS REFERENCE TO RELATED APPLICATIONS

This application is a U.S. national phase application of International Application No. PCT/EP2019/065816 filed on Jun. 17, 2019, which claims the benefit of EP Application Serial No. 18178391.1 filed on Jun. 19, 2018 and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

According to the MR method in general, the object, for example the body of the patient to be examined, is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated, e.g., by means of a refocusing pulse (for example a 180° pulse). This produces an echo signal (spin echo) in the receiving coils.

To realize spatial resolution in the body, constant magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. A set of k-space data is converted to a MR image by means of an image reconstruction algorithm.

Spiral MR imaging is one of the most efficient sampling patterns for the acquisition of data in k-space. Furthermore, the spiral scheme has been shown to be robust against flow effects due to its inherent first gradient moment nulling property. Therefore, the spiral approach is of increasing interest for clinical applications such as diagnostic imaging of the brain, the abdomen and the heart. Furthermore, real-time applications are of interest, which especially benefit from the frequent update of the central portion of k-space with each new spiral interleaf. This allows the tracking of fast contrast changes in dynamic studies.

However, spiral imaging is very hardware demanding, and the required image reconstruction algorithm is more complex than the simple Fourier transform typically used for the image reconstruction of data sampled on Cartesian grids. Although the spiral scheme uses the available magnetic field gradient system of the used MR device more efficiently than other techniques, it is sensitive to gradient system imperfections and off-resonance caused by main field inhomogeneities which cause blurring and considerably degrade the image quality in terms of sharpness. These possible sources of image degradation have to be considered if spiral images are to be obtained with a quality that is comparable to the high quality offered by the robust standard MR sequences.

Both for the verification of the operability of the design of a spiral MR imaging sequence in a specific MR hardware environment as well as the control of the image quality in the clinical practice, there is a demand to enable the assessment of the sharpness of the resulting MR images in different image regions.

A known method for measuring and correcting for different types of image imperfections induced by the used MR device is the acquisition and reconstruction of MR images from a phantom that comprises suitable features arranged in a predetermined pattern such that the correspondence between the positions of the respective features in the MR image and their actual positions in the phantom is established.

However, the known phantoms conventionally used in MR imaging do not enable the assessment of image sharpness in different image regions as it would be required to assess the operability of a given spiral imaging sequence. The volume of the known phantoms is largely unstructured, so that, apart from the edges of their specific features, there are no areas available for assessing the image sharpness.

The U.S. Pat. No. 5,336,999 D2 discloses results of an assessment of sensitivity of sensitivity of image resolution to local magnetic field inhomogeneities in Transverse Spin Inversion (TSI) EPI acquisition sequences.

SUMMARY OF THE INVENTION

From the foregoing it is readily appreciated that there is a need for an improved MR imaging technique. It is an object of the invention to address the above-mentioned limitations and to provide a phantom that is inexpensive to produce and enables simple, practical and fast assessment of image sharpness, in particular for checking the image quality in MR imaging with spiral acquisition.

In accordance with the invention, a method of MR imaging is provided. The method comprises the following steps:
subjecting a phantom, which comprises a volume filled with a bulk of granules of solid material surrounded by a liquid, to an imaging sequence,
acquiring MR signals from the phantom,
reconstructing an MR image from the acquired MR signals, and
deriving a measure of the local image sharpness in two or more different image regions from the MR image, wherein each image region is a representation of a part of the phantom volume.

According to the invention, a phantom is employed that is designed to have 'structure' in all of its volume. This enables assessing the image sharpness at each location within the phantom volume. MR signals are acquired from the phantom and a sharpness metric is derived from at least two spatially different regions (located within the volume of the phantom) from the MR image.

The phantom is realized by filling a volume with a bulk of granules of solid material surrounded by a liquid. Preferably, MR signals from the liquid are acquired, which can be a liquid as conventionally used in MR phantoms. The granules are preferably formed from a material which emits no or only a very low MR signal. From the paper '*Extraction and validation of correlation lengths from interstitial velocity fields using diffusion-weighted MRI*' by K. W. Moser and J. G. Georgiadis in MRI 22(2004) 257-268 (D1) it is known per se to use a packed-bed phantom consisting of a water-saturated bed of randomly packed spheres to investigate diffusion measurements.

The method of the invention includes to subject the phantom to an (MR) imaging sequence which generates magnetic resonance signals from the phantom. A magnetic resonance image is reconstructed from the acquired magnetic resonance signal. The magnetic resonance image represents the content of the phantom, i.e. the distribution, size and MR response aspects of the constitution of the granules. As the constitution, size and distribution of the granules is pre-determined, the magnetic resonance image can be employed to gauge the image sharpness associated with the (MR) imaging sequence and the spatial (gradient) magnetic field distribution of the magnetic resonance examination system.

Further it is noted, that any (MR) imaging sequence is more or less sensitive to off-resonance effects due to main magnetic field inhomogeneities and to deviations of the gradient magnetic fields, such as gradient non-linearities and gradient delays. Such off-resonances and gradient deviations cause the actual trajectory along which k-space data are sampled to be not precisely in conformity with the instructions to play-out the (MR) imaging sequence and according to which the magnetic resonance image is reconstructed. These derivations apply in principle to any type of (MR) imaging sequence. It is noted that in practice sampling along spiral trajectories of k-space is particularly sensitive to these deviations. Accordingly, the present invention is particularly useful to assess image sharpness for these spiral type (MR) imaging sequences.

In a preferred embodiment of the invention, the diameter of the granules is two to five times, preferably three to four times larger than the voxel size of the MR image. The preferred size of the granules of the phantom relates to the resolution of the MR image for which the sharpness needs to be examined. In practice, the diameter of the granules should be about three to four times larger than the voxel size of the MR image under test, i.e. typically 3 to 4 mm. However, the exact size of the granules is not a very critical parameter.

The shape of the granules is also not very critical. Preferably, the granules are of a roundish, irregular shape (not perfectly spherical) such that the granules do not tend to form stacked (or crystal-like) structures. In an alternative embodiment, a bulk of spherical granules of equal size or with a narrow distribution of diameters may be used as well. It is preferred to have the granules randomly packed within the phantom volume.

In a preferred embodiment, the material of the granules contains no nuclei contributing to the MR signals such that MR signals are acquired only from the liquid surrounding the granules. Essentially the same result can be obtained if the transverse relaxation time of the contribution from the material of the granules to the MR signals is significantly shorter (preferably <1 ms) than the transverse relaxation time of the contribution from the surrounding liquid (preferably >100 ms). In this case, the MR signal contribution from the granules can be suppressed, e.g., by acquiring the MR signals as echo signals at a sufficiently long echo time. However, a contribution from the granules to the MR signals is not critical for assessing the local image sharpness according to the invention as long as it is ensured that the relative contribution from the granules to the overall MR signals is not dominant (less than 50%).

The paramagnetic susceptibility of the material of the granules should be essentially equal to the paramagnetic susceptibility of the surrounding liquid in order to avoid magnetic field distortions at the boundaries between the granules and the surrounding liquid. Such field distortions could corrupt the assessment of image sharpness. If the surrounding liquid is water, the magnetic susceptibility of the material of the granules should thus be close to $\chi=9\cdot 10^{-6}$. Moreover, the surrounding liquid should be free of dissolved gas in order to prevent the formation of gas bubbles, which could also cause local field distortions. Hence, a de-gassing procedure should ideally be applied to the surrounding liquid before its use in the phantom.

The above requirements are fulfilled by choosing a plastic material for the granules, preferably (high-density) polyethylene (PE) or polymethyl methacrylate (PMMA), while the surrounding liquid is water with ions dissolved therein, preferably copper, nickel or manganese ions. Such liquids are typically used in phantoms. The ion concentration can be varied to optimally tune the transverse and longitudinal relaxation times. A carbohydrate, preferably a mineral oil, may also be used as the surrounding liquid. PMMA as the material of the granules is particularly well-suited in combination with water, while PE is well-suited in combination with mineral oil as the surrounding liquid.

According to yet another preferred embodiment of the invention, the phantom volume is of a spherical shape. A spherical shape of the phantom minimizes distortions of the main magnetic field within the phantom volume. In a practical embodiment, a spherical container of a suitable material (e.g. plastics) is used which encloses the densely packed bulk of granules and which is filled up with the surrounding liquid.

In a preferred embodiment of the invention, the imaging sequence comprises at least one RF excitation pulse and modulated magnetic field gradients, wherein the MR signals are acquired along at least one spiral k-space trajectory. The method of the invention is particularly well-suited for assessing image sharpness in combination with spiral acquisition schemes. The image resolution should be essentially isotropic.

According to an alternative embodiment of the invention, the imaging sequence comprises a number of RF excitation pulses and a number of magnetic field gradients applied in different directions, wherein the MR signals are acquired along a number of radial k-space trajectories. The method of the invention is also well-suited for assessing image sharpness in combination with radial acquisition schemes. Spiral and radial acquisition schemes have in common that the radial k-space position increases (or decreases) monotonically with time. In general, the method of the invention can be usefully applied in combination with any imaging sequence having long readout-times (>10 ms).

Preferably, a magnitude MR image (without phase information) is reconstructed from the acquired MR signals, wherein the measure of the local image sharpness is derived by computing the average voxel value and the standard deviation of the pixel values for each of the image regions and by computing the ratio of the standard deviation and the average voxel value for each of the image regions. The size of the respective image region should be chosen such that it contains, preferably, more than 100, most preferably more than 1000 voxels in order to have sufficient statistical accuracy. The ratio of the standard deviation and the average voxel value is than considered as a metric for the local image sharpness at the center of the respective image region.

The method of the invention described thus far can be carried out by means of a MR device that is arranged to perform the following steps:
subjecting the phantom (19) to an imaging sequence,
acquiring MR signals from the phantom (19),
reconstructing an MR image from the acquired MR signals, and
deriving a measure of the local image sharpness in two or more different image regions from the MR image, wherein each image region is a representation of a part of the phantom volume. To implement the invention in the MR device, it is sufficient for the MR device to be configure io acquire magnetic resonance signals and (have) an magnetic resonance image reconstructed form the magnetic resonance signal. The reconstruction may be incorporated in the MR device or may be done remotely, e.g. in the cloud. Such an MR device in current practice preferably includes at least one main magnet coil for generating a uniform static magnetic field within an examination volume, a number of gradient coils for generating switched magnetic field gradients in different spatial directions within the examination volume, at least one RF coil for generating RF pulses within the examination volume and/or for receiving MR signals from a phantom, which comprises a volume filled with a bulk of granules of solid material surrounded by a liquid, positioned in the examination volume, a control unit for controlling the temporal succession of RF pulses and switched magnetic field gradients, and a reconstruction unit for reconstructing a MR image from the received MR signals. The method of the invention can be implemented, for example, by a corresponding programming of the reconstruction unit and/or the control unit of the MR device.

The method of the invention can be advantageously carried out in most MR devices in clinical use at present. To this end it is merely necessary to provide a phantom of the above-described type and to utilize a computer program by which the MR device is controlled such that it performs the above-explained method steps of the invention. The computer program may be present either on a data carrier or be present in a data network so as to be downloaded for installation in the control unit of the MR device.

A further subject of the invention is a phantom for MR imaging. As explained herein above, the phantom comprises a volume filled with a bulk of granules of solid material surrounded by a liquid. According to the invention, the phantom fulfils one or—if technically viable—more of the characteristics from the following list:
the granules are randomly densely packed in the phantom volume,
the granules are of a roundish, irregular shape,
the granules are spherical and of equal size,
the material of the granules is selected such that it contains no nuclei producing an MR signal at a given magnetic field strength,
the material of the granules is selected such that the transverse relaxation time of the MR signal produced by the material of the granules is significantly shorter than the transverse relaxation time of an MR signal produced by the surrounding liquid,
the phantom volume is of a spherical shape,
the material of the granules is a plastic, preferably polyethylene or polymethyl methacrylate,
the surrounding liquid is water with ions dissolved therein, preferably copper, nickel or manganese ions, or a carbohydrate, preferably a mineral oil,
the paramagnetic susceptibility of the material of the granules essentially equals the paramagnetic susceptibility of the surrounding liquid,
the surrounding liquid is free of dissolved gas.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
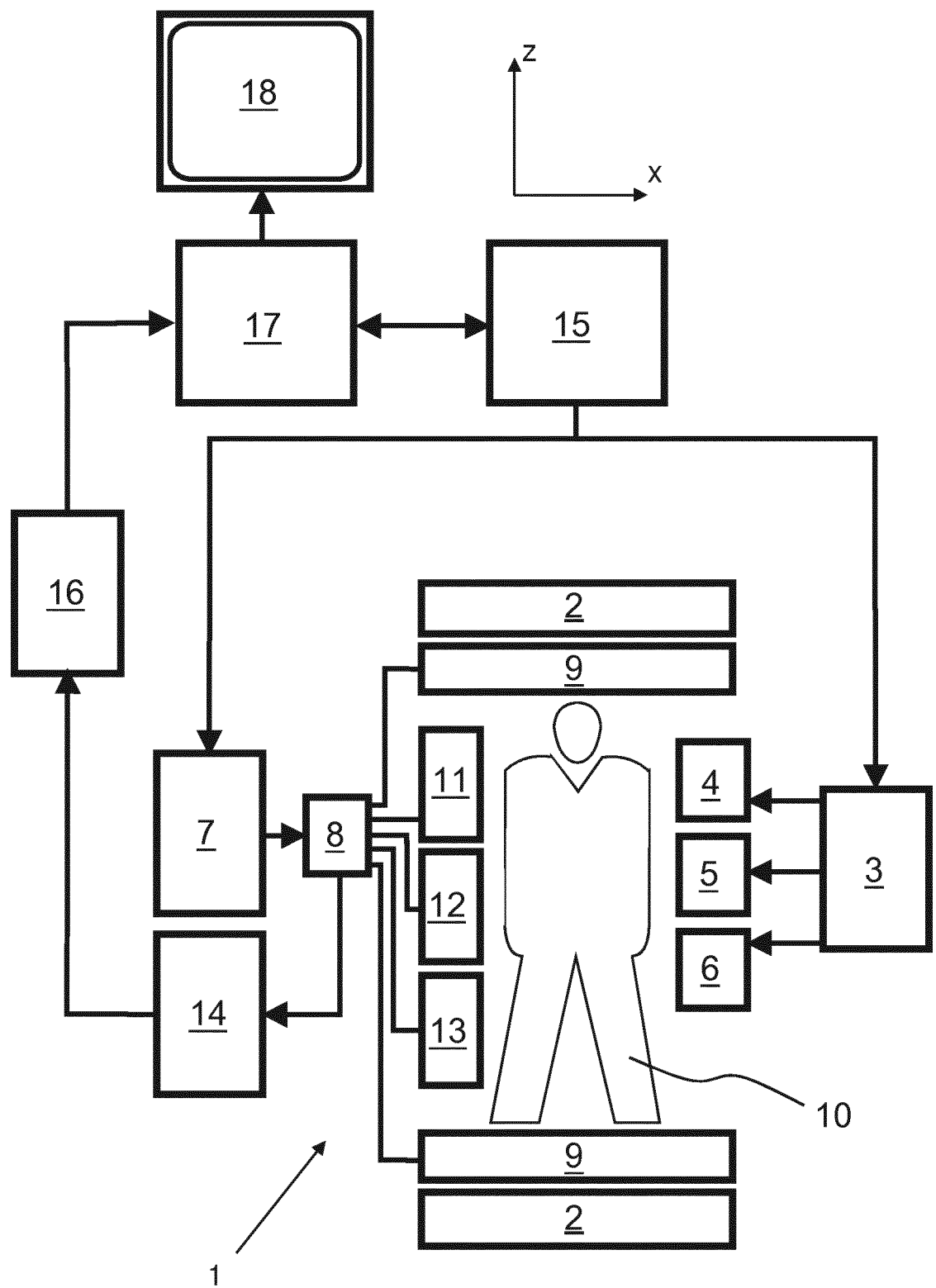
FIG. 1 shows a MR device for carrying out the method of the invention.

With reference to FIG. 1, a MR device 1 is schematically shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions. The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo (TSE) imaging, and the like to acquire the MR signals according to the invention. For the selected sequence, the receiver 14 receives a single or a plurality of MR data along the respective k-space trajectories in rapid succession following each RF excitation pulse. A data acquisition system 16 performs analog-to-digital conversion of the received signals and converts each MR signal to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

In the method of the invention, the body 10 of the patient is replaced by a phantom 19 as described in more detail below. The MR device 1 is arranged, e.g. by appropriate programming of the host computer 15 and the reconstruction processor 17, to perform the imaging method of the invention as described herein above and in the following.

Figure 2:
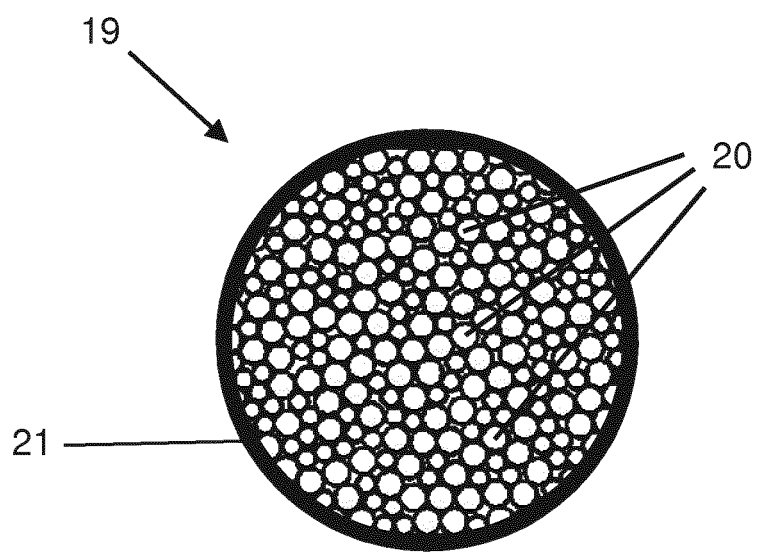
FIG. 2 schematically illustrates the design of the phantom used in the method of the invention.

With continuing reference to FIG. 1 and with further reference to FIG. 2, an embodiment of the imaging method of the invention is explained.

FIG. 2 schematically shows the design of the phantom 19 used in the method of the invention in a cross-sectional view. The phantom 19 is of a spherical shape. The phantom 19 comprises a volume filled with a bulk of spherical granules of solid material. Some of the granules are designated by reference number 20 in FIG. 2. The volume containing the granules is filled up with a liquid. The volume is enclosed by a liquid-tight container 21 of a suitable material such as, e.g., plastics. The wall thickness of the container 21 must be sufficient to give the phantom 19 stability. The phantom 19 can be placed in the examination volume of the MR device 1 whenever it is necessary for analyzing image sharpness.

The structure provided by the granules 20 enables assessing the image sharpness at each location within the phantom volume. The diameter of the granules 20 is three to four times larger than the voxel size of the MR image of which the sharpness is to be assessed. The granules 20 are of a spherical shape and essentially randomly packed within the phantom volume.

The material of the granules 20 is PMMA. The transverse relaxation time of this material is less than 1 ms. MR signal contributions from the granules 20 to the overall MR signal acquired from the phantom 19 will thus be negligible.

The liquid surrounding the granules 20 is water with copper ions dissolved therein. Such a liquid is typically used in phantoms. The ion concentration is chosen to provide optimum transverse and longitudinal relaxation time values for the respective imaging sequence. The paramagnetic susceptibility of PMMA is very similar to that of water such that susceptibility artefacts at the boundaries of the granules 20 are avoided.

According to the invention, the phantom 19 is subjected to an imaging sequence comprising at least one RF excitation pulse and modulated magnetic field gradients, wherein the MR signals are acquired along at least one spiral k-space trajectory from the phantom 19.

For assessing image sharpness in combination with the spiral acquisition, a magnitude MR image is reconstructed from the acquired MR signals, wherein a measure of the local image sharpness is derived by computing the average voxel value and the standard deviation of the voxel values for the voxels in each of a number of different image regions (each of which being entirely contained within the phantom volume). The ratio of the standard deviation and the average pixel value provides a metric for image sharpness at the center of the respective image region.

The proposed phantom in combination with the described imaging method and the computation of the particular sharpness metric enables very easy, robust and fast assessment of image sharpness over the entire field of view (depending on the size of the phantom volume).

The invention claimed is:

1. A method of assessment of image quality of a magnetic resonance (MR) image, the method comprising:
    providing a phantom, which comprises a volume filled with a bulk of granules of solid material surrounded by a liquid, the granules' material's paramagnetic susceptibility being essentially equal to a surrounding liquid's paramagnetic susceptibility,
    subjecting the phantom to an imaging sequence,
    acquiring MR signals from the phantom,
    reconstructing an MR image from the acquired MR signals, and
    deriving a measure of sharpness associated with off-resonance effects of the MR image due to main magnetic field inhomogeneities and to deviations of gradient magnetic fields in two or more different image regions from the MR image, wherein each image region is a representation of a different part of the phantom volume.

2. The method of claim 1, wherein a diameter of the granules is two to five times larger than a voxel size of the MR image.

3. The method of claim 1, wherein the granules are spherical and of essentially equal size.

4. The method of claim 1, wherein the granules are randomly packed in the phantom volume.

5. The method of claim 1, wherein the material of the granules contains no nuclei contributing to the MR signals.

6. The method of claim 1, wherein a transverse relaxation time of the contribution from the material of the granules to the MR signals is significantly shorter than the transverse relaxation time of a contribution from the surrounding liquid to the MR signals.

7. The method of claim 1, wherein the phantom volume is of a spherical shape.

8. The method of claim 1, wherein the surrounding liquid is free of dissolved gas.

9. The method of claim 1, wherein the material of the granules is a plastic.

10. The method of claim 1, wherein the surrounding liquid is any of water with ions dissolved therein.

11. The method of claim 10, wherein the ions include at least one selected from a group consisting of copper, nickel or manganese ions, a carbohydrate.

12. The method of claim 1, wherein the imaging sequence comprises at least one RF excitation pulse and modulated magnetic field gradients, wherein the MR signals are acquired along at least one spiral k-space trajectory.

13. The method of claim 1, wherein the imaging sequence comprises a number of RF excitation pulses and a number of magnetic field gradients applied in different directions, wherein the MR signals are acquired along a number of radial k-space trajectories.

14. The method of claim 1, wherein the measure of the image sharpness is derived by computing an average voxel value and a standard deviation of the voxel values for each of the image regions and by computing a ratio of the standard deviation and the average voxel value for each of the image regions.

15. The method of claim 1, wherein deviations of the gradient magnetic fields includes at least one of gradient non-linearities or gradient delays.

16. The method of claim 1, wherein a diameter of the granules is three to four times larger than a voxel size of the MR image.

17. The method of claim 1, wherein the material of the granules is a is at least one selected from a group consisting of: polyethylene or polymethyl methacrylate.

\* \* \* \* \*